(12) United States Patent
Steely-Tarshish et al.

(10) Patent No.: US 11,703,767 B2
(45) Date of Patent: Jul. 18, 2023

(54) OVERLAY MARK DESIGN FOR ELECTRON BEAM OVERLAY

(71) Applicant: KLA Corporation, Milpitas, CA (US)

(72) Inventors: Inna Steely-Tarshish, Yokneam Ilit (IL); Stefan Eyring, Weilburg (DE); Mark Ghinovker, Yoqneam Ilit (IL); Yoel Feier, Haifa (IL); Eitan Hajaj, Ashqelon (IL); Ulrich Pohlmann, Jena (DE); Nadav Gutman, Zichron Ya'aqov (IL); Chris Steely, Yokneam Ilit (IL); Raviv Yohanan, Qiryat Motzkin (IL); Ira Naot, Milpitas, CA (US)

( * ) Notice: Subject to any disclaimer, the term of this patent is extended or adjusted under 35 U.S.C. 154(b) by 0 days.

(21) Appl. No.: 17/487,784

(22) Filed: Sep. 28, 2021

(65) Prior Publication Data

US 2022/0413395 A1 Dec. 29, 2022

Related U.S. Application Data

(60) Provisional application No. 63/215,555, filed on Jun. 28, 2021.

(51) Int. Cl.
*G03F 7/20* (2006.01)
*G03F 7/00* (2006.01)

(52) U.S. Cl.
CPC ...... *G03F 7/70633* (2013.01); *G03F 7/70683* (2013.01)

(58) Field of Classification Search
CPC .......................... G03F 7/70633; G03F 7/70683
See application file for complete search history.

(56) References Cited

U.S. PATENT DOCUMENTS

| 6,985,618 | B2 | 1/2006 | Adel et al. |
| 7,193,699 | B2 | 3/2007 | Michelsson |
| 7,292,328 | B2 | 11/2007 | Kreh et al. |
| 7,417,719 | B2 | 8/2008 | Michelsson |
| 7,477,370 | B2 | 1/2009 | Michelsson et al. |

(Continued)

FOREIGN PATENT DOCUMENTS

DE 102005014595 A1 10/2006

OTHER PUBLICATIONS

WIPO, International Search Report for International Application No. PCT/US2022/033899, dated Oct. 20, 2022.

(Continued)

*Primary Examiner* — Peter B Kim
(74) *Attorney, Agent, or Firm* — Hodgson Russ LLP

(57) ABSTRACT

Electron beam overlay targets and method of performing overlay measurements on a target using a semiconductor metrology tool are provided. One target includes a plurality of electron beam overlay elements and a plurality of two-dimensional elements that provide at least one two-dimensional imaging. The plurality of two dimensional elements are an array of evenly-spaced polygonal gratings across at least three rows and at least three columns. Another target includes a plurality of electron beam overlay elements and a plurality of AIMid elements. Each of the electron beam overlay elements includes at least two gratings that are overlaid at a perpendicular orientation to each other. The plurality of AIMid elements includes at least two gratings that are overlaid at a perpendicular orientation to each other.

10 Claims, 11 Drawing Sheets

(56) References Cited

U.S. PATENT DOCUMENTS

| | | |
|---|---|---|
| 7,657,077 B2 | 2/2010 | Michelsson et al. |
| 7,973,931 B2 | 7/2011 | Michelsson et al. |
| 8,200,003 B2 | 6/2012 | Michelsson |
| 8,200,004 B2 | 6/2012 | Michelsson et al. |
| 8,264,534 B2 | 9/2012 | Michelsson |
| 8,705,837 B2 | 4/2014 | Michelsson et al. |
| 10,002,806 B2 | 6/2018 | Amir et al. |
| 10,473,460 B2 | 11/2019 | Gutman et al. |
| 10,474,040 B2 | 11/2019 | Laske et al. |
| 11,112,369 B2 | 9/2021 | Gready |
| 11,182,892 B2 | 11/2021 | Michelsson et al. |
| 2004/0165764 A1 | 8/2004 | Michelsson |
| 2005/0008217 A1 | 1/2005 | Luu et al. |
| 2006/0103838 A1 | 5/2006 | Richter et al. |
| 2006/0240580 A1 | 10/2006 | Michelsson |
| 2008/0062415 A1 | 3/2008 | Michelsson |
| 2008/0249728 A1 | 10/2008 | Michelsson et al. |
| 2014/0362363 A1* | 12/2014 | Cai .................... G03F 7/70133 355/77 |
| 2014/0375984 A1 | 12/2014 | Choi et al. |
| 2015/0177135 A1 | 6/2015 | Amit et al. |
| 2015/0204664 A1 | 7/2015 | Bringoltz et al. |
| 2016/0179017 A1 | 6/2016 | Yohanan et al. |
| 2016/0266505 A1 | 9/2016 | Amit et al. |
| 2018/0232478 A1 | 8/2018 | Golovanevsky et al. |
| 2018/0252514 A1 | 9/2018 | Pandev et al. |
| 2018/0321597 A1 | 11/2018 | Javaheri et al. |
| 2019/0163076 A1 | 5/2019 | Lee et al. |
| 2019/0271542 A1 | 9/2019 | Shchegrov et al. |
| 2020/0033737 A1 | 1/2020 | Yerushalmi et al. |
| 2020/0124982 A1* | 4/2020 | Feler .................... G03F 9/7076 |
| 2020/0373182 A1 | 11/2020 | Ghinovker |
| 2021/0240089 A1 | 8/2021 | Golotsvan et al. |

OTHER PUBLICATIONS

WIPO, Written Opinion of the International Searching Authority for International Application No. PCT/US2022/033899, dated Oct. 20, 2022.

* cited by examiner

OVERLAY MARK DESIGN FOR ELECTRON BEAM OVERLAY

CROSS REFERENCE TO RELATED APPLICATIONS

This disclosure is based on, and claims priority to, U.S. Provisional Application No. 63/215,555, filed on Jun. 28, 2021, the entire disclosure of which is incorporated by reference herein.

FIELD OF THE DISCLOSURE

This disclosure relates to overlay measurements in semiconductor devices.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

The relative position of structures within a semiconductor device is referred to as overlay (OVL). The measurement of overlay error between successive patterned layers on a wafer is a process control technique in integrated circuit manufacturing. Overlay accuracy generally pertains to the determination of how accurately a first patterned layer aligns with respect to a second patterned layer disposed above or below it and to the determination of how accurately a first pattern aligns with respect to a second pattern disposed on the same layer.

Metrology processes are used at various steps during a semiconductor manufacturing process to monitor and control one or more semiconductor layer processes. An overlay measurement generally specifies how accurately a first patterned layer aligns with respect to a second patterned layer disposed above or below it or how accurately a first pattern aligns with respect to a second pattern disposed on the same layer. Overlay error is one of the characteristics that is monitored and controlled. The overlay error is typically determined with an overlay target having structures formed on one or more layers of a workpiece (e.g., a semiconductor wafer). If the two layers or patterns are properly formed, then the structure on one layer or pattern tends to be aligned relative to the structure on the other layer or pattern. If the two layers or patterns are not properly formed, then the structure on one layer or pattern tends to be offset or misaligned relative to the structure on the other layer or pattern. Overlay error is the misalignment between any of the patterns used at different stages of the semiconductor fabrication processes.

Overlay metrology targets are printed to measure registration between two or more layers. The structures on the wafer may take the form of gratings, and these gratings may be periodic. If the two layers or patterns are properly formed, then the structure on one layer or pattern may be aligned relative to the structure on the other layer or pattern.

Various technology and processes for measuring overlay have been developed and employed with varying degrees of success. Overlay metrology has become a technique that helps enable lithographic patterning. Overlay measurements are done by various algorithms, which extract the overlay term from the target's asymmetry. The overlay metrology target is designed in such a way so the overlay would induce an asymmetry signature in the reflected signal.

Current methods for optical overlay measurement rely on two main technologies: imaging and scatterometry. Scatterometry overlay measurement and imaging-based overlay measurement use different target designs due to their different measurement methods. In imaging, the position of periodic targets is measured in the field of view of the optical system and the overlay is deduced from positions of targets printed in different layers. Scatterometry utilizes interference between electromagnetic (EM) waves scattered by periodic overlay marks (targets with periodic structures) printed at different layers to deduce the relative displacement of the layers. In both cases a control on amplitudes and phases of the diffraction orders of the scattered electromagnetic waves may provide an effect on accuracy and precision of overlay measurement.

When overlay errors are observed, an overlay measurement may be used to apply corrections and to keep overlay errors within desired limits. For example, overlay measurements may be fed into an analysis routine that calculates scanner corrections, as well as other statistics, which may be used by an operator in order to better align the lithography tool used in the process. In typical fabrication operations, semiconductor manufacturing processes are run in batches called lots. A lot, or a wafer lot, is defined as a quantity of wafers which are processed together as a single group. Conventional overlay monitor and control techniques generally take a single set of scanner corrections and apply the same set for all wafers in the same lot.

However, improved target designs and methods of measurement are needed as semiconductor devices become more complex.

BRIEF SUMMARY OF THE DISCLOSURE

An embodiment of the present disclosure provides a target. The target may comprise a plurality of electron beam overlay elements and a plurality of two-dimensional elements that provide at least one two-dimensional imaging. The plurality of two-dimensional elements may be an array of evenly-spaced polygonal gratings across at least three rows and at least three columns.

According to an embodiment of the present disclosure, each of the plurality of electron beam overlay elements may have diagonal fine segmentation. The target may further comprise a region of interest in one of the electron beam overlay elements.

According to an embodiment of the present disclosure, each of the plurality of electron beam overlay elements may be a plurality of evenly-spaced polygonal gratings across at least three rows and at least three columns. The target my further comprise a region of interest around a center polygon in each of the plurality of electron beam overlay elements and each of the plurality of two-dimensional elements.

Another embodiment of the present disclosure provides a target. The target may comprise a plurality of electron beam overlay elements and a plurality of AIMid elements. Each of the electron beam overlay elements may include at least two gratings that are overlaid at a perpendicular orientation to each other. The plurality of AIMid elements may include at least two gratings that are overlaid at a perpendicular orientation to each other.

According to an embodiment of the present disclosure, the target may further comprise a first hollow polygon grating around each of the plurality of electron beam overlay elements and a second hollow polygon grating around each of the plurality of AIMid elements.

According to an embodiment of the present disclosure, the target may further comprise a plurality of evenly-spaced polygonal elements around each of the electron beam overlay elements and each of the AIMid elements. One of the polygonal elements may be disposed in each corner of each of the electron beam overlay elements and each of the AIMid elements. The target may further comprise a region of interest around each of the electron beam overlay elements, AIMid elements, and evenly-spaced polygonal elements.

An embodiment of the present disclosure provides a method of performing overlay measurements on any of the disclosed targets using a semiconductor metrology tool.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Figure 1:
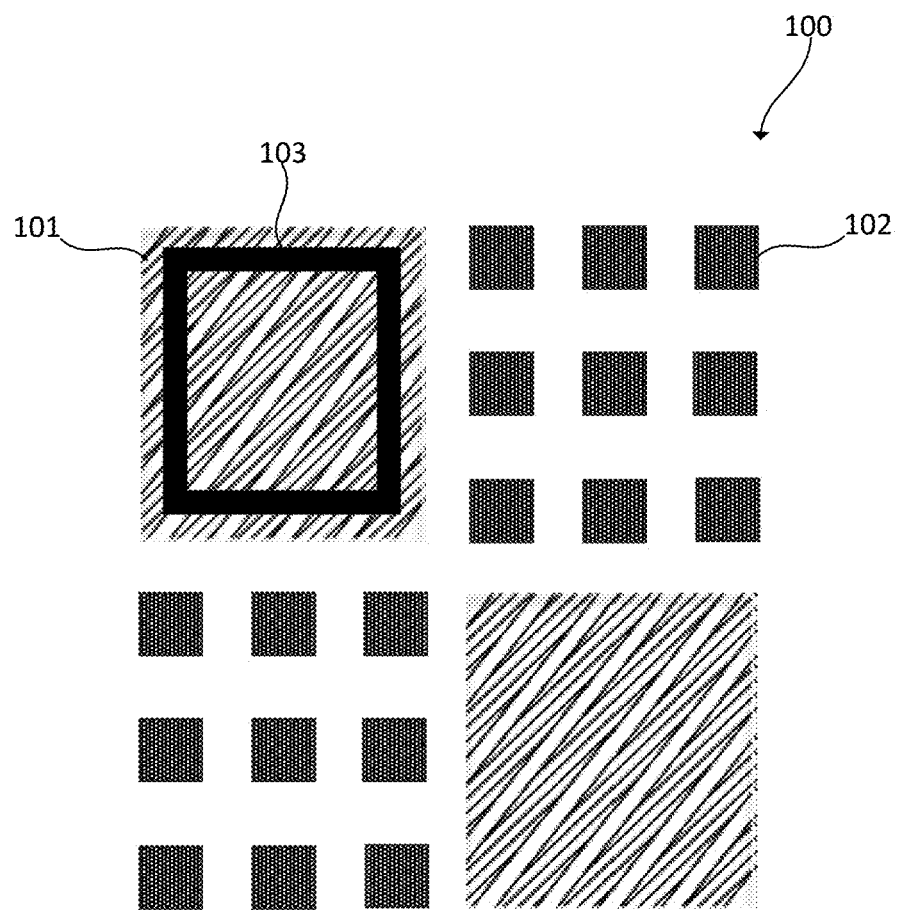
FIG. 1 is a combined AIMid with an electron beam overlay target that has diagonal fine segmentation and region of interest placement.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

In general, an overlay error between two process layers or a shift between two sets of structures on the same layer may be determined using overlay targets, for which the target structures are designed with a known relationship between their symmetry characteristics and discrepancies from such symmetry correspond to overlay error in such targets. As used herein, a layer may refer to any suitable materials, such as a semiconductor or a photoresist layer that are generated and patterned for fabrication of a wafer device or test structure. Although the following target examples are shown to have structures on two (or more) layers for measuring overlay, each target may include two (or more) sets of structures on the same layer for determining a shift error between such set of structures. Additionally, embodiments of the present disclosure may be applied to any type of periodic targets, and such targets may be formed in an inactive area (e.g., scribe line) or in an active region of a die on of a production wafer (e.g., as part of a device portion of a die). Techniques that are described herein may also be applied to targets for determining other types of characteristics, such as critical dimension (CD), CD uniformity (CDU), edge placement error (EPE), pattern fidelity, etc.

Overlay targets typically occupy an expensive location on an integrated circuit. Semiconductor manufacturers generally seek to decrease measurement time and wafer area of these overlay targets. Space on a wafer can be saved, measurement time can be made faster, and a comparison of results from the two technologies can be performed by combining imaging-based and scatterometry-based targets. Thus, including two targets in an area of an integrated circuit and measuring both overlay targets at the same time would provide benefits to the semiconductor manufacturing process.

Embodiments disclosed herein combine electron beam overlay (eOVL) with scatterometry overlay (SCOL). Currently the scanning electron microscope (SEM) technology is used as a ruler for optical metrology measurements. Embodiments disclosed herein provide solutions with new target designs for electron beam overlay and combination use case with optical measurements. Target architypes also can combine optical image-based overlay (IBO) and diffraction-based overlay (DBO) targets with electron beam overlay specialized targets. Alternating the combined targets can enable denser sampling, which can increase model accuracy.

Target designs disclosed herein can reduce measurement move-acquire-measurement (MAM) time and improve measurements accuracy because the regions of interest (ROI) can contain both X and Y information content within small field of view (FOV). For example, in one ROI, one grating may be for information in the X direction, and another grating may be for information in the Y direction. It may not be necessary to move to two different targets because all the information is contained in one target. Thus, the disclosed targets increase the information content per area.

The measurements can be applied on coarse and fine pitch of the different target architypes. The target stack materials can vary between line and space features. The reverse combination use case can use the current optical targets with a denser sampling of electron beam overlay targets. A combined design of four cell scatterometry overlay and electron beam overlay also can be used.

The embodiments disclosed herein can enable scatterometry target axis separation, which contains two cells per direction as in standard four cell design with prolonged bars in both directions of each layer per cell. This can provide physical separation between the different alignment scheme layers. The region of interest placement on such target type can be separated for each layer. Since multiple region of interest used per direction both targets architecture of bar over bar and bar over trench with induced overlay which required for scatterometry target (f0) measurable regardless of their shift coverage. Both directions can be applicable within the same target as well with prolonged bars per axis.

Any design image-based overlay or diffraction-based overlay can enable an electron beam overlay target, center of electron beam overlay, and optical target that coincide. This can eliminate process variation effect, placement error effect, and can improve the ability to correct of the modeled terms. Due to design rules, the electron beam overlay target may be placed as closest as possible to the optical target.

Additional segments can be added to the optical target to fill in the space occupied by electron beam overlay target placement or prolongation of the bars, which will enable more information content.

FIG. 1 is a combined advanced imaging metrology in-die (AIMid) with an electron beam overlay target that has diagonal fine segmentation and region of interest placement. The target 100 includes electron beam overlay elements 101. Each electron beam overlay elements 101 can have diagonal fine segmentation. The target 100 also can include a region of interest 103 (represented by the black box) in one of the electron beam overlay elements 101. The region of interest 103 may be related to the setup of the image processing algorithm and the type of image processing algorithm used. The region of interest 103 may be positioned such as to exclude edges of the electron beam overlay elements 101, which may allow the only measurement direction to be diagonal. This may allow design rules measurements in the case of diagonal segmentation due to device and illumination source shape constraints. To process very small semiconductor structures, special illumination conditions (e.g., annular, structured, etc.) may be used during the lithography step. These illumination conditions may be optimized for the specific process step and may be only good for certain pattern shapes (e.g., diagonal lines). The allowed pattern shapes for a specific process step may be defined by the so called "design rules." Patterns which violate the design rules (e.g., standard target designs) may suffer from processing problems. Being able to design targets which follow the design rules for the actual device patterns may be advantageous. The electron beam overlay elements 101 may be measured in a perpendicular direction to the diagonal fine segmentation.

The structure sizes, dimensions, and angles of the segmentations of the target 100 may depend on the semiconductor manufacturer, technology node, and processing step. Nodes may operate at structure sizes of a few nm to several μm. In the case of diagonal lines, 15° to 30° may be common, but other angles are possible. The target 100 may have overall side lengths between 10 μm and 60 μm.

The target 100 also can include two-dimensional elements 102 that provide at least one two-dimensional imaging. The two-dimensional elements 102 are in an array of evenly-spaced polygonal gratings. The gratings can be square, for example. The gratings can be arrayed in at least three rows and at least three columns, though different numbers of rows or columns are possible. The two-dimensional elements may be about 0.5 μm to 2 μm in size. The two-dimensional elements 102 may be made of a certain material (e.g., Si, metals, etc.) which is surrounded by or embedded in another material (e.g., $SiO_2$, etc.).

The electron beam overlay elements 101 and the two-dimensional elements 102 can be arranged across the target 100. For example, two rows and two columns of features can be included in the target 100. The top row can include electron beam overlay elements 101 and the two-dimensional elements 102. The bottom row can include electron beam overlay elements 101 and the two-dimensional elements 102, but in an opposite order than the top row. Thus, the electron beam overlay elements 101 are perpendicular to the two-dimensional elements 102 and diagonal to the electron beam overlay elements 101.

Figure 2:
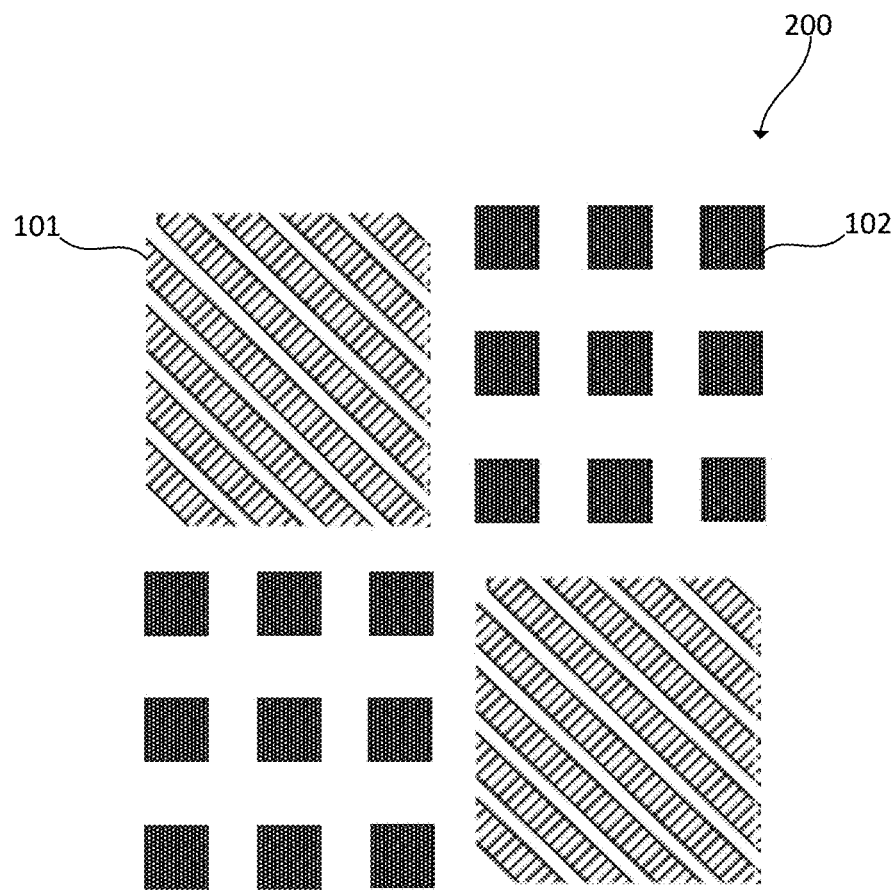
FIG. 2 is another combined AIMid with an electron beam overlay target that has diagonal fine segmentation and region of interest placement.

FIG. 2 is another combined AIMid with an electron beam overlay target that has diagonal fine segmentation and region of interest placement. In the target 200, the electron beam overlay elements 101 have diagonal fine segmentation. However, the electron beam overlay elements 101 are oriented in an opposite manner to those in FIG. 1. The size of the target 200 and its structures may be similar to the sizes of the target 100 described above.

Figure 3:
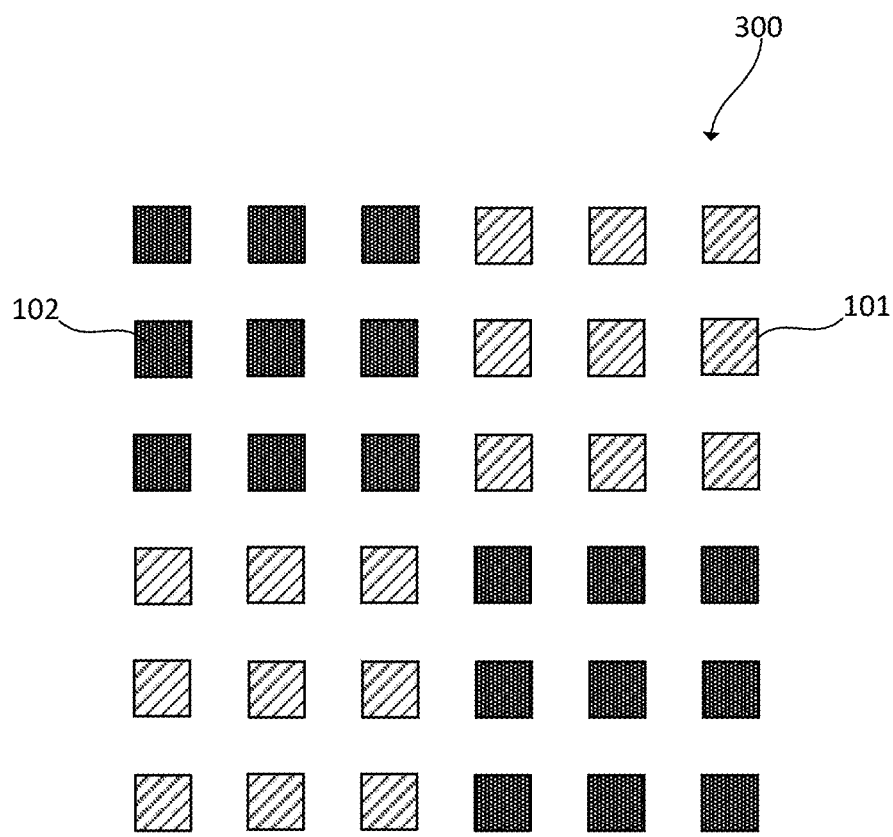
FIG. 3 is an AIMid with an electron beam overlay combined target.

FIG. 3 is an AIMid with an electron beam overlay combined target. In the target 300, the electron beam overlay elements 101 are in the form of evenly-spaced polygonal gratings. The gratings can be square, for example. The gratings can be arrayed in at least three rows and at least three columns, though different numbers of rows or columns are possible. The target 300 may be 12 μm by 12 μm in size, and may contain a total of 36 elements (between the electron beam overlay elements 101 and the two-dimensional elements 102), with two 3×3 grids per layer with two layers. Each element may be 1 μm in size and may be spaced 1 μm apart. According to some embodiments, other arrangements and spacings of elements in the target 100 may be possible. The electron beam overlay elements 101 and the two-dimensional elements 102 may be different sizes and/or different shapes. The electron beam overlay elements 101 and the two-dimensional elements 102 may be the same size and/or the same shape. The size of the target 300 and its structures may be similar to the sizes of the target 100 described above.

Figure 4:
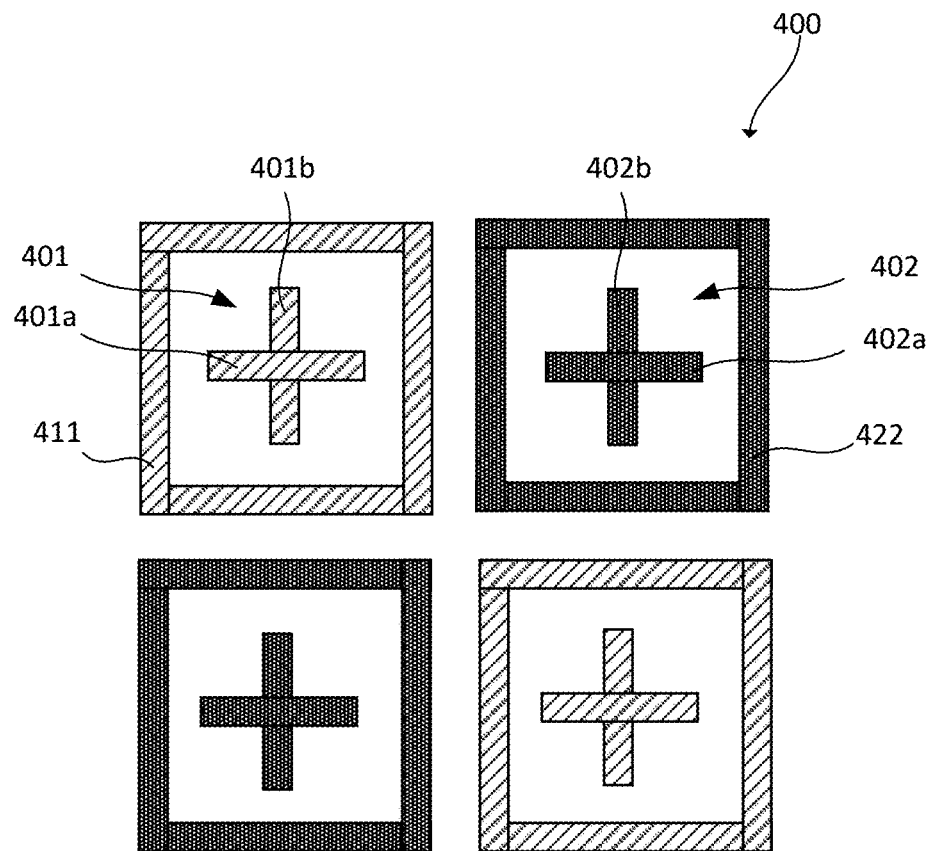
FIG. 4 is another AIMid with an electron beam overlay combined target.

FIG. 4 is a combined AIMid with an electron beam overlay target. The target 400 includes a plurality of electron beam overlay elements 401. The plurality of electron beam overlay elements 401 each include at least two gratings 401a, 401b that are overlaid at a perpendicular orientation to each other. For example, as shown in FIG. 4, the gratings 401a, 401b may be overlaid such that they form a cross shape.

The target 400 can also include a plurality of AIMid elements 402. The plurality of AIMid elements 402 each include at least two gratings 402a, 402b that are overlaid at a perpendicular orientation to each other. For example, as shown in FIG. 4, the gratings 402a, 402b may be overlaid such that they form a cross shape. The shape of the target 400 may be generated by a modulation of materials. For example, structures may be made of very small "white dots" embedded in "black material." To form the cross and the enclosing square of the electron beam overlay elements 401 and the AIMid elements 402, larger areas may be fully filled with the "white" material which then replaces the "black" material.

The electron beam overlay elements 401 and the AIMid elements 402 can be arranged across the target 400. For example, two rows and two columns of features can be included in the target 400. The top row can include electron beam overlay elements 401 and the AIMid elements 402. The bottom row can include electron beam overlay elements 401 and the AIMid elements 402, but in an opposite order than the top row. Thus, the electron beam overlay elements 401 are perpendicular to the AIMid 402 and diagonal to the electron beam overlay elements 401. Target 400 may include additional rows/columns of elements forming a larger grid. The size of the target 400 and its structures may be similar to the sizes of the target 100 described above.

The target 400 can also include a first hollow polygon grating 411 around each of the plurality of electron beam overlay elements 401, and a second hollow polygon grating 422 around each of the plurality of AIMid elements 402. The first hollow polygon grating 411 and the second hollow polygon grating 422 may have a box shape.

Figure 5:
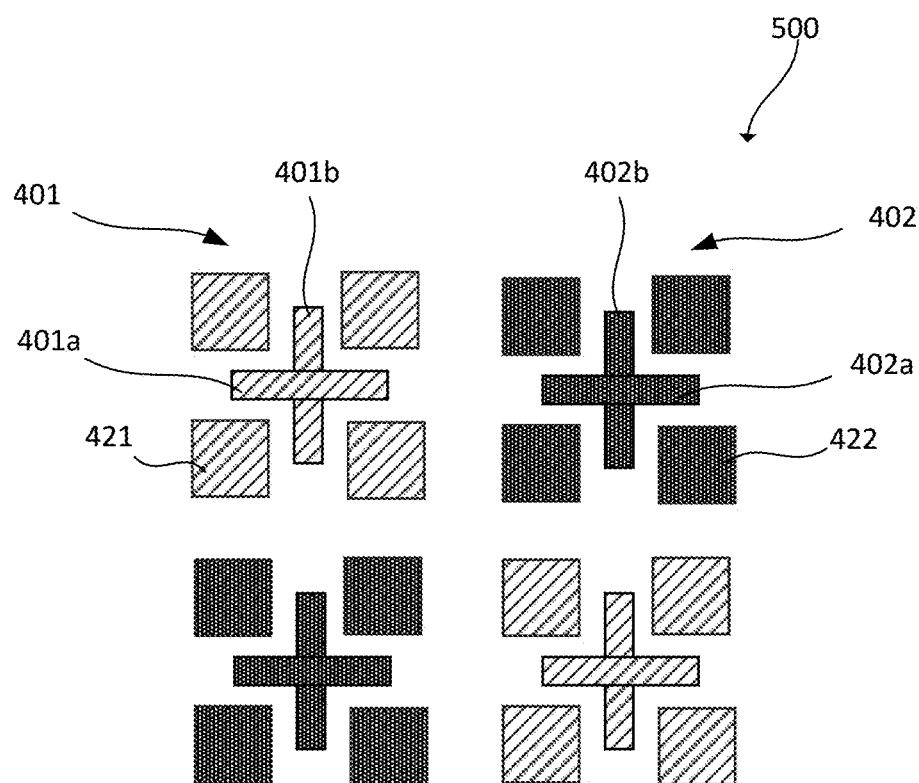
FIG. 5 is another AIMid with an electron beam overlay combined target.

FIG. 5 is another AIMid with an electron beam overlay combined target. In the target 500, a plurality of evenly-spaced polygonal elements are provided around each of the electron beam overlay elements 401 and the AIMid elements 402. The plurality of evenly-spaced polygonal elements may include first polygonal elements 421 provided around each of the electron beam overlay elements 401, and second polygonal elements 422 provided around each of the AIMid elements 402. For example, as shown in FIG. 5, there may be four first polygonal elements 421 evenly-spaced around each electron beam overlay element 401, and four second polygonal elements 422 evenly-spaced around each AIMid element 402. One of the first polygonal elements 421 may be disposed in each corner of each of the electron beam overlay elements 401, and one of the second polygonal elements 422 may be disposed in each corner of each of the AIMid elements 402. The size of the target 500 and its structures may be similar to the sizes of the target 100 described above.

Figure 6:
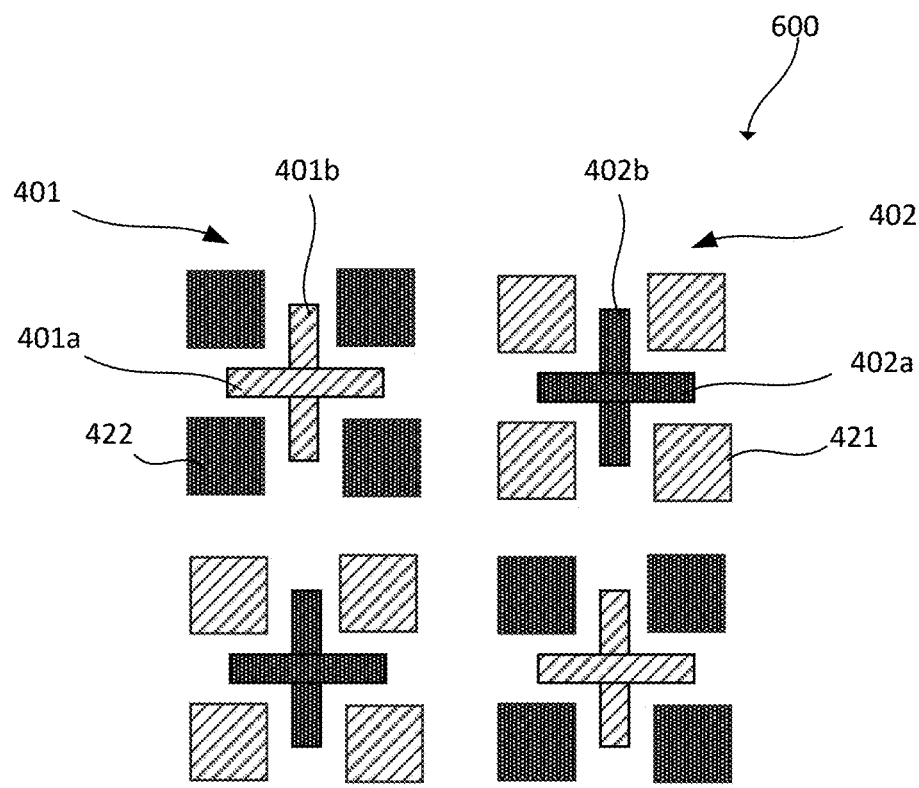
FIG. 6 is another AIMid with an electron beam overlay combined target that enables dual measurement for both optical and electron beam overlay target.

FIG. 6 is another AIMid with an electron beam overlay combined target that enables dual measurement for both optical and electron beam overlay target. The target 600 differs from target 500 in that the first polygonal elements 421 may be provided around each of the AIMid elements 402, and the second polygonal elements 422 may be provided around each of the electron beam overlay elements 401. For example, as shown in FIG. 6, there may be four first polygonal elements 421 evenly-spaced around each AIMid element 402, and four second polygonal elements 422 evenly-spaced around each electron beam overlay element 401. One of the first polygonal elements 421 may be disposed in each corner of each of the AIMid elements 402, and one of the second polygonal elements 422 may be disposed in each corner of each of the electron beam overlay elements 401. The size of the target 600 and its structures may be similar to the sizes of the target 100 described above.

Figure 7:
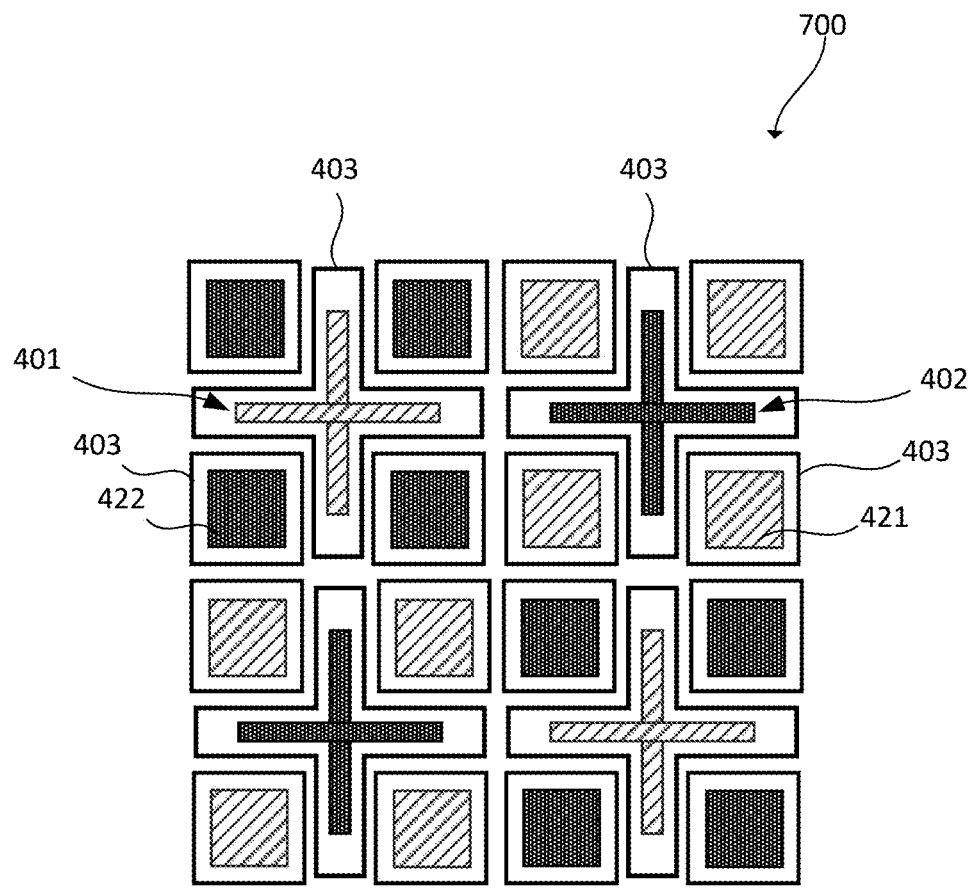
FIG. 7 shows region of interest placement on 2D fine segmentation on an AIMid target.

FIG. 7 shows region of interest placement on 2D fine segmentation on an AIMid target. The target 700 differs from target 600 in that a region of interest 403 is provided around each of the electron beam overlay elements 401, AIMid elements 402, and the evenly-spaced polygonal elements 421, 422. The size of the target 700 and its structures may be similar to the sizes of the target 100 described above.

Figure 8:
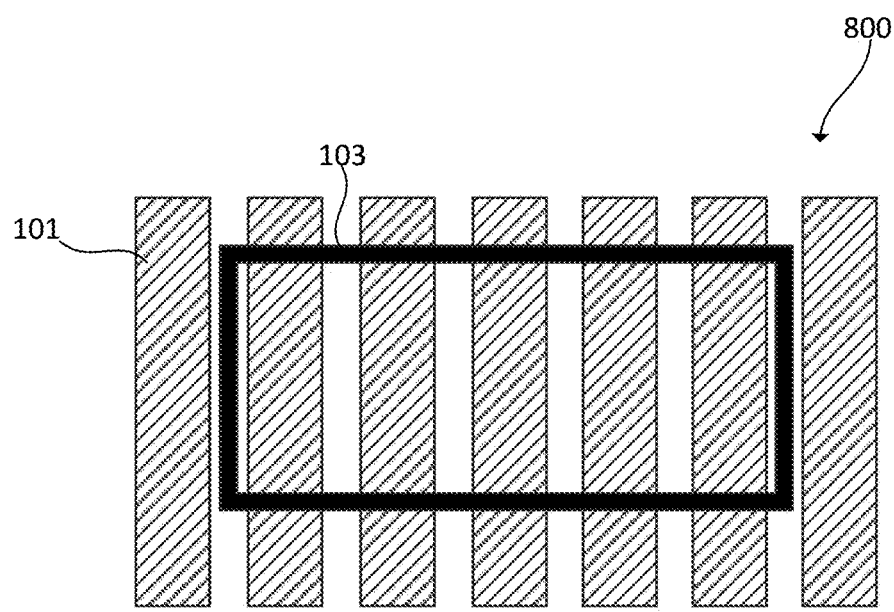
FIG. 8 shows region of interest placement on fine segmentation.

FIG. 8 shows region of interest placement on fine segmentation. The target 800 includes electron beam overlay elements 101 and a region of interest 103. The electron beam overlay elements 101 may include a plurality of evenly-spaced gratings. As shown in FIG. 8, the plurality of evenly-spaced gratings may have a vertical orientation. The region of interest 103 may include one ore move of the plurality of evenly-spaced gratings. The regions of interest 103 may be related to the setup of the image processing algorithm and the type of image processing algorithm used. Segments of the grating at the outer bars can be removed due to their higher sensitivity to aberration for parallel segmentations. The region of interest placement on the fine segmentation can exclude the extreme segments to improve aberration accuracy within a single bar. The size of the target 800 and its structures may be similar to the sizes of the target 100 described above.

Figure 9:
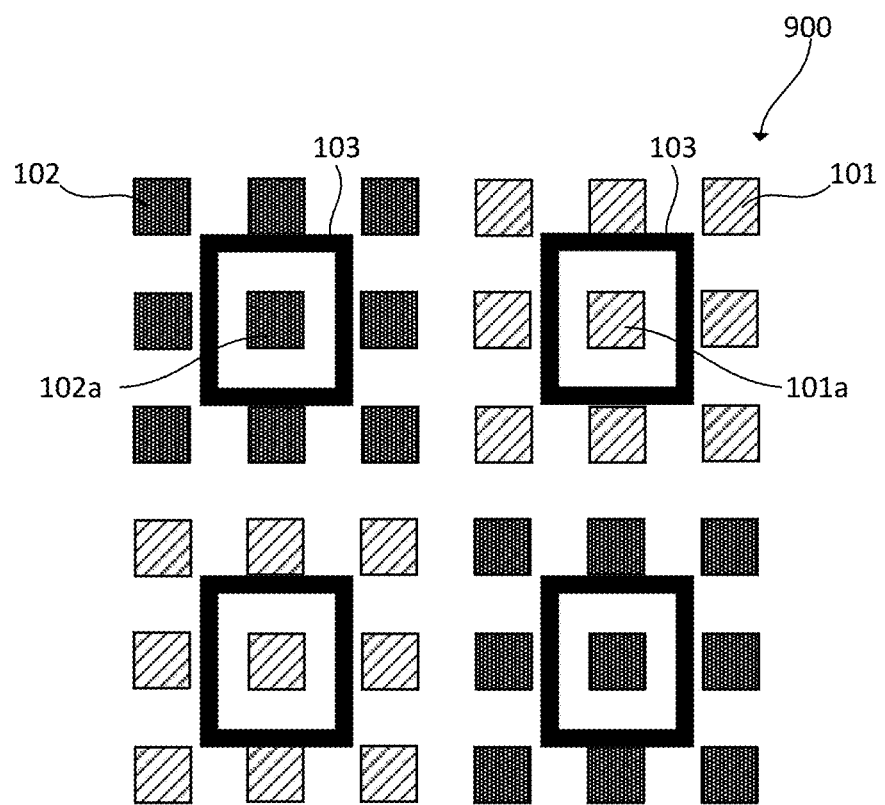
FIG. 9 shows region of interest placement on 2D fine segmentation on an AIMid target.

FIG. 9 shows region of interest placement on 2D fine segmentation on an AIMid target. The target 900 differs from the target 300 in that a region of interest 103 is provided around a center polygon 101a of the electron beam overlay elements 101 and a center polygon 102a of the two-dimensional elements 102. The regions of interest 103 may be provided around one or more other polygons of the electron beam overlay elements 101 and the two-dimensional elements 102. The regions of interest 103 may be provided around certain polygons of the electron beam overlay elements 101 and the two-dimensional elements 102 having the same relative location (e.g., center polygons) or different relative locations. The size of the target 900 and its structures may be similar to the sizes of the target 100 described above.

Figure 10:
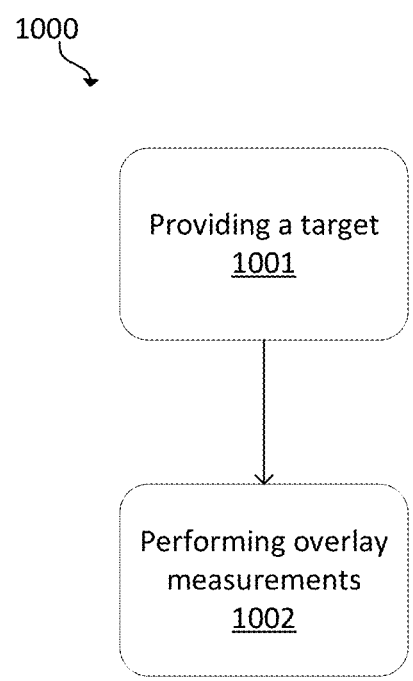
FIG. 10 is an embodiment of a method in accordance with the present disclosure.

FIG. 10 is a flowchart of a method 1000. In the method, a target is provided at 1001. The target can be one of the targets disclosed herein. Overlay measurements are performed at 1002 using a semiconductor metrology tool. The semiconductor metrology tool may be a conventional tool, which utilizes conventional processing algorithms, or may be an electron beam tool, which uses different measurement techniques. For example, one beam spot can be applied to a grating. A single reflectivity value is collected per grating. Each cell will contain an induced offset to calculate overlay. At least four cells with different induced offsets may be used. This method can be propagated until "n" cells occur. A beam spot can be scanned to average spot position accuracy.

Figure 11:
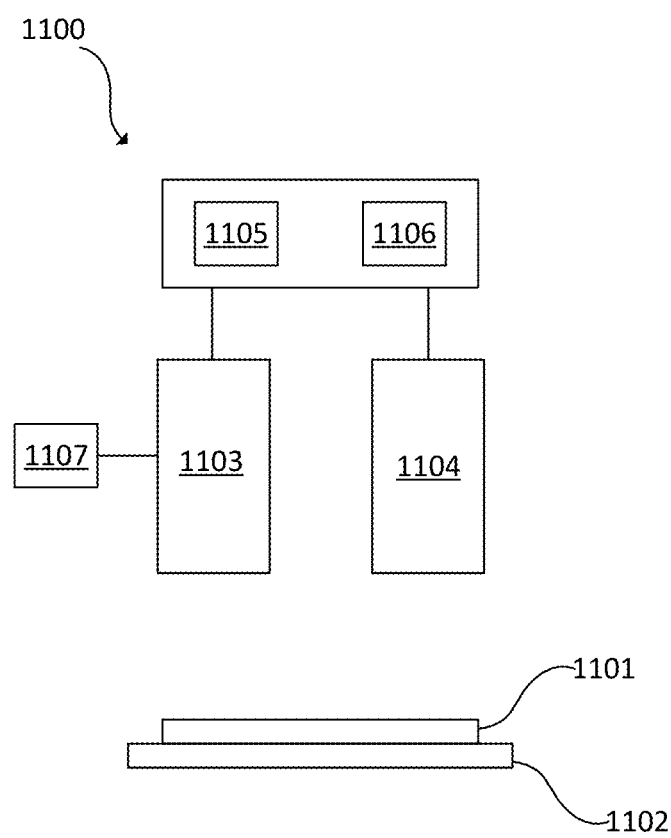
FIG. 11 is an embodiment of a system in accordance with the present disclosure.

FIG. 11 is a diagram of a system 1100. The system 1100 includes a chuck 1102 configured to hold a wafer 1101. The wafer 1101 includes one or more overlay targets, such as those described in the embodiments herein.

The system 1100 includes an imaging optical system 1103 configured to measure the overlay target on the chuck 1102. The imaging optical system 1103 can include an illumination source oriented to direct radiation onto a specific location of the wafer 1101 and one or more detectors oriented to detect an optical signal which from the wafer 1101. The illumination source in the optical system 1103 can generate an illumination beam directed at the wafer 1101. The imaging optical system 1103 also can include various lenses, optical components, other steering devices, or other beam transport devices. The illumination beam can be an optical beam or an electron beam.

The imaging optical system 1103 can be used for acquisition such that the imaging optical system 1103 is part of the acquisition sequence of the scatterometry measurement.

The system 1100 includes a scatterometry system 1104 configured to measure the overlay target on the chuck 1102. The scatterometry system 1104 can be configured to measure the same overlay target as the imaging optical system 1103.

The scatterometry system 1104 can include an illumination source oriented to direct radiation onto a specified location of the wafer 1101 and one or more detectors oriented to detect a scatterometry signal which has been scattered by the wafer 1101. The illumination source in the scatterometry system 1104 can generate an illumination beam directed at the wafer 1101. The scatterometry system

1104 also can include various lenses or optical components. The scatterometry system 1104 can use the imaging optical system 1103 or information from the imaging optical system 1103 during the scatterometry sequence.

Measurements of the wafer 1101 by the imaging optical system 1103 and the scatterometry system 1104 can be performed while the wafer 1101 remains on the chuck 1102. Thus, the wafer 1101 may not move between measurement by the imaging optical system 1103 and the scatterometry system 1104. In an instance, a vacuum around the wafer 1101 is not broken between measurements by the imaging optical system 1103 and the scatterometry system 1104. In an instance, one of the measurements by the imaging optical system 1103 and the scatterometry system 1104 occurs after the other. In another instance, the measurements by the imaging optical system 1103 and the scatterometry system 1104 occur at least partially simultaneously or at the same time.

While disclosed as one system 1100, the imaging optical system 1103 and the scatterometry system 1104 can be in two separate systems. Each of the systems may have a separate chuck.

A processor 1105 is in electronic communication with an electronic data storage unit 1106, the imaging optical system 1103, and the scatterometry system 1104. The processor 1105 may include a microprocessor, a microcontroller, or other devices. The processor 1105 can receive output from the imaging optical system 1103 and the scatterometry system 1104.

The system 1100 can include an imaging optical system acquisition module 1107 configured to acquire the overlay target on the chuck 1102 with the imaging optical system 1103. The optical system acquisition module 1107 forms an acquisition image that can be used by the imaging optical system 1103 or the scatterometry system 1104. While illustrated as separate units, the imaging optical system acquisition module 1107 may be part of the imaging optical system 1103. The imaging optical system acquisition module 1107 also may be part of the processor 1105.

The processor 1105 and electronic data storage unit 1106 may be part of the system 1100 or another device. In an example, the processor 1105 and electronic data storage unit 1106 may be part of a standalone control unit or in a centralized quality control unit. Multiple processors 1105 or electronic data storage unit 1106 may be used. In an embodiment, the processor 1105 may be disposed in the system 1100.

The processor 1105 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 1105 to implement various methods and functions may be stored in readable storage media, such as a memory in the electronic data storage unit 1106 or other memory.

The processor 1105 may be coupled to the components of the system 1100 in any suitable manner (e.g., via one or more transmission media, which may include wired and/or wireless transmission media) such that the processor 1105 can receive output. The processor 1105 may be configured to perform a number of functions using the output.

The processor 1105, other system(s), or other subsystem(s) described herein may be part of various systems, including a personal computer system, image computer, mainframe computer system, workstation, network appliance, interne appliance, or other device. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 1105 may be configured to perform a number of functions using the output of the imaging optical system 1103, and the scatterometry system 1104, or other output. For instance, the processor 1105 may be configured to send measurement results of the wafer 1101. In another example, the processor 1105 can determine electron beam overlay and/or scatterometry overlay error within the target. In another example, the processor 1105 may be configured to send the output to an electronic data storage unit 1106 or another storage medium. The processor 1105 may be further configured as described herein.

The processor 1105 may be configured according to any of the embodiments described herein. The processor 1105 also may be configured to perform other functions or additional steps using the output of the system 1100 or using images or data from other sources.

In another embodiment, the processor 1105 may be communicatively coupled to any of the various components or sub-systems of system 1100 in any manner known in the art. Moreover, the processor 1105 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 1105 and other subsystems of the system 1100 or systems external to system 1100.

In some embodiments, various steps, functions, and/or operations of system 1100 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 1105 (or computer system) or, alternatively, multiple processors 1105 (or multiple computer systems). Moreover, different sub-systems of the system 1100 may include one or more computing or logic systems. Therefore, the above description should not be interpreted as a limitation on the present disclosure but merely an illustration.

An additional embodiment relates to a non-transitory computer-readable medium storing program instructions executable on a processor for inspecting a wafer, as disclosed herein. In particular, a processor, such as the processor 1105, can be coupled to a memory in an electronic data storage medium, such as the electronic data storage unit 1106, with non-transitory computer-readable medium that includes executable program instructions. The computer-implemented method may include any step(s) of any method(s) described herein. For example, processor 1105 may be programmed to perform some or all of the steps of FIG. 9. The memory in the electronic data storage unit 1106 may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

In another embodiment, a method of designing of the targets disclosed herein can be used. The method may be performed with a processor, such as those described therein. The gratings of the first and second periodic structures of the targets disclosed herein can be optimized.

While specific configurations are shown in the embodiments illustrated herein, variations that include all or some of the features of these embodiments are possible.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A target comprising:
a plurality of electron beam overlay elements configured for electron beam metrology; and
a plurality of two-dimensional elements that provide two-dimensional imaging and are configured for optical metrology, wherein the plurality of two-dimensional elements are an array of evenly-spaced polygonal gratings across at least three rows and at least three columns
wherein the plurality of electron beam overlay elements and the plurality of two-dimensional elements are arranged such that one of the plurality of electron beam overlay elements is perpendicular with two of the plurality of two-dimensional elements and diagonal with another of the plurality of electron beam overlay elements whereby the plurality of electron beam overlay elements and the plurality of two-dimensional elements are symmetrical around a center of the target.

2. The target of claim 1, wherein each of the plurality of electron beam overlay elements has diagonal fine segmentation.

3. The target of claim 2, further comprising a region of interest in one of the electron beam overlay elements.

4. The target of claim 3, wherein the region of interest is smaller than and inside of the one of the electron beam overlay elements.

5. The target of claim 1, wherein each of the plurality of electron beam overlay elements is a plurality of evenly-spaced polygonal gratings across at least three rows and at least three columns.

6. The target of claim 5, further comprising a region of interest around a center polygon in each of the plurality of electron beam overlay elements and each of the plurality of two-dimensional elements.

7. A method of performing overlay measurements on the target of claim 1 using a semiconductor metrology tool.

8. The target of claim 1, wherein the target has side lengths between 10 μm and 60 μm.

9. The target of claim 1, wherein each of the plurality of two-dimensional elements has a dimension from 0.5 μm to 2 μm.

10. The target of claim 1, wherein each of the plurality of two-dimensional elements is made of silicon, a metal, or $SiO_2$.

* * * * *